United States Patent [19]

Tetsu et al.

[11] Patent Number: 4,685,034
[45] Date of Patent: Aug. 4, 1987

[54] ELECTRIC DEVICE COMPRISING INTEGRATED CIRCUITS

[75] Inventors: Sadayuki Tetsu, Yokohama; Yasuo Tanishima, Fujisawa, both of Japan

[73] Assignee: Fujitsu Limited, Kawasaki, Japan

[21] Appl. No.: 830,485

[22] Filed: Feb. 18, 1986

Related U.S. Application Data

[63] Continuation of Ser. No. 537,016, Sep. 29, 1983, abandoned.

[30] Foreign Application Priority Data

Sep. 30, 1982 [JP] Japan .................................. 57-172163

[51] Int. Cl.⁴ .............................................. H02B 1/08
[52] U.S. Cl. .................................. 361/424; 174/35 R; 361/399
[58] Field of Search .............. 174/35 R; 361/390-395, 361/399-400, 424

[56] References Cited

U.S. PATENT DOCUMENTS

| | | | |
|---|---|---|---|
| 2,296,678 | 9/1942 | Linger | 174/35 R |
| 2,963,577 | 12/1960 | Errichiello et al. | 361/424 |
| 3,638,148 | 1/1972 | Hallford et al. | 333/84 M |
| 3,777,287 | 12/1973 | Louvel | 333/84 M |
| 3,816,911 | 6/1974 | Knappenberger | 361/424 |
| 4,370,700 | 1/1983 | Duddler et al. | 361/424 |
| 4,404,617 | 9/1983 | Ohyama | 361/424 |
| 4,426,773 | 1/1984 | Hargis | 361/412 |

FOREIGN PATENT DOCUMENTS

| | | |
|---|---|---|
| 0065425 | 11/1982 | European Pat. Off. |
| 1280355 | 10/1968 | Fed. Rep. of Germany ...... 361/399 |
| 2629053 | 1/1978 | Fed. Rep. of Germany ...... 361/399 |
| 0047909 | 9/1979 | Fed. Rep. of Germany ...... 361/424 |

OTHER PUBLICATIONS

Jackson et al, "Three-Dimensional Electrical Interconnection System", IBM Technical Disclosure Bulletin, vol. 14, No. 11, 4/72, pp. 3305-3306.
Caulfield et al., "Integrated Circuit Carrier", IBM Technical Disclosure Bulletin, vol. 14, No. 10, 3/72, p. 2903.
Wheeler et al., "Housing for Electronically Switched Circuits", Technical Digest, No. 9, 1/68, pp. 19-20.

Primary Examiner—A. D. Pellinen
Assistant Examiner—Gregory D. Thompson
Attorney, Agent, or Firm—Staas & Halsey

[57] ABSTRACT

An electronic device includes a case having a partitional wall dividing the case interior into a first compartment and a second compartment and having one or more interrupting walls in the first compartment. Substrates are disposed in the first compartment and are arrayed in rows, with the interrupting wall being interposed between the adjacent rows. A circuit board is disposed in the second compartment and is electrically connected to the integrated circuits by elements extending through the partitional wall. A signal input terminal and a signal output terminal for the substrates are disposed at one side wall of the case. This structure makes it possible to realize a small-sized device, easy mounting and demounting of the substrates, and unvarying electrical characteristics.

4 Claims, 11 Drawing Figures

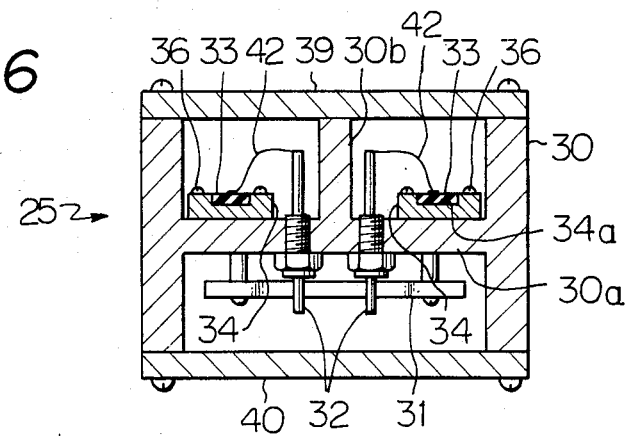
Fig. 6
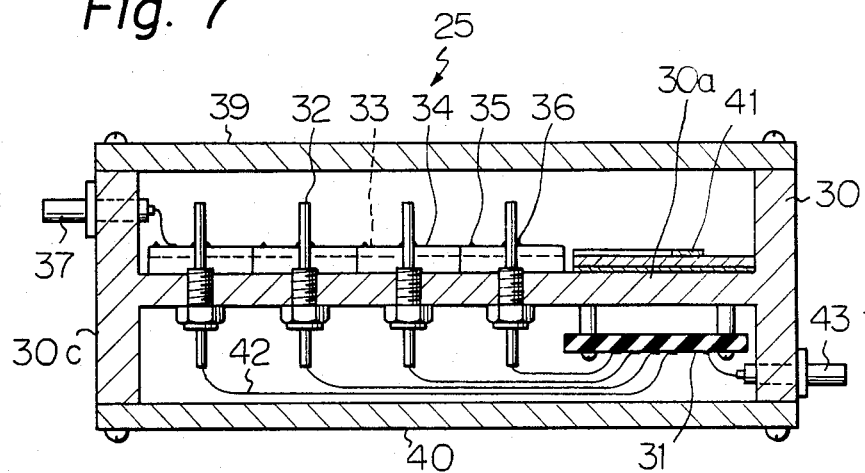
Fig. 7
Fig. 8
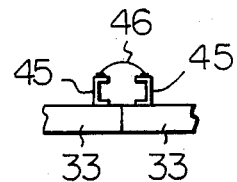
Fig. 9
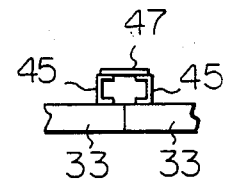

ELECTRIC DEVICE COMPRISING INTEGRATED CIRCUITS

This is a continuation of co-pending application Ser. No. 537,016 filed on Sept. 29, 1983, now abandoned.

BACKGROUND OF THE INVENTION (1) Field of the Invention

The present invention relates to an electronic device which comprises a plurality of integrated circuits contained in a case and electrically interconnected so as to completely perform a specific function.

(2) Description of the Prior Art

In the prior art, electronic devices of the type described above are well known, a typical one being an amplifier used in a receiver of a microwave communication apparatus. In this type of device, each integrated circuit is mounted in a case after being adjusted so as to perform a required function. However, there are instances in which the functions of the integrated circuits vary after the integrated circuits are mounted in the case. Therefore, it is necessary to dismount the integrated circuits from the case and readjust them. As a result, it is desired that the work of mounting and dismounting the integrated circuits be made easy.

Moreover, this type of device is provided with a circuit board for supplying electric power to the integrated circuits and with connecting elements for electrically connecting the integrated circuits and the circuit board. Accordingly, the device becomes large in size. Therefore, it is desired that the size of this type of device be minimized and that a small-sized apparatus be realized.

A conventional device of the type described above has many drawbacks. In particular, the work of mounting and dismounting the integrated circuits is complicated and the device is large in size as described in detail hereinafter with reference to the drawings.

SUMMARY OF THE INVENTION

It is an object of the present invention to provide a new and improved structure of an electronic device of the type described hereinbefore which makes it possible to easily mount and demount integrated circuits.

Another object of the present invention is to provide a small-sized electronic device of the type described hereinbefore.

According to the present invention, there is provided an electronic device which comprises a case made of a conductive material and having an intermediate partitional wall dividing the interior of the case into first and second compartments and at least one interrupting wall disposed perpendicularly to the partitional wall within the first compartment. A plurality of integrated circuit substrates having integrated circuits forming a main signal circuit which processes an input signal and emits an output signal, are detachably secured to the partitional wall of the case in the first compartment. The integrated circut substrates are arrayed in rows with the interrupting wall being interposed between the adjacent rows. A circuit board is secured to the partitional wall of the case in the second compartment. The integrated circuit substrates and the circuit board are electrically interconnected by connecting elements which extend perpendicularly through, and are secured to, the partitional wall of the case. A signal input terminal and a signal output terminal for the integrated circuit substrates extend through, and are secured to, one of the side walls of the case.

The present invention is now described in detail based on the preferred embodiments and in contrast with the prior art, with reference being made to the accompanying drawings.

BRIEF DESCRIPTION OF THE DRAWINGS

FIG. 6 is a cross-sectional view of the main IF amplifier of FIG. 5 taken along the line 6—6 in FIG. 5;

FIG. 7 is a cross-sectional view of the main IF amplifier of FIG. 5 taken along the line 7—7 in FIG. 5;

FIGS. 8 and 9 are embodiments of the electrical connection between the integrated circuits;

DESCRIPTION OF THE PREFERRED EMBODIMENTS

First, the prior art is described with reference to FIGS. 1 through 4.

Figure 1:
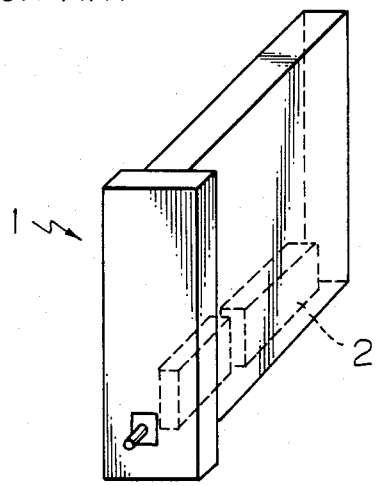
FIG. 1 is a schematic perspective view of a receiver of a conventional quasi-millimeter wave band communication apparatus.

FIG. 1 is a diagram of a receiver of a conventional quasi-millimeter wave band (20 GHz) pulse code modulation multiplex communication apparatus. The receiver 1 comprises a plurality of devices, including a main IF amplifier 2.

Figure 2:
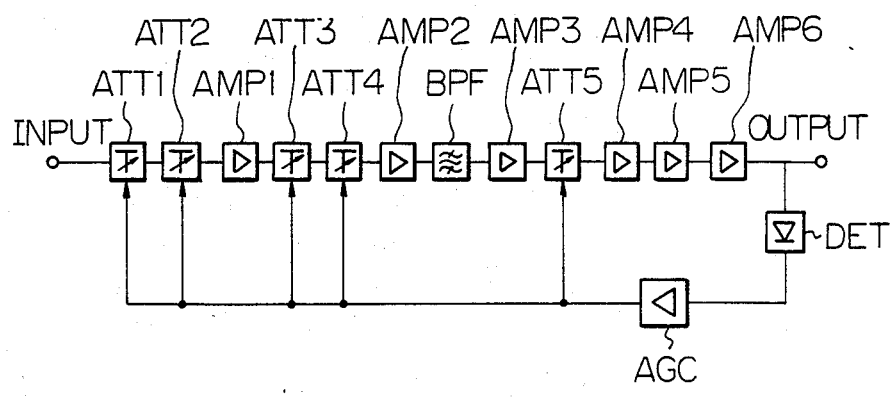
FIG. 2 is a block circuit diagram of a conventional main intermediate-frequency (IF) amplifier used in the receiver in FIG. 1.

As is illustrated in FIG. 2, the main IF amplifier 2 consists of a plurality of modules, including five attenuators ATT1 through ATT5, six amplifiers AMP1 through AMP6, a band pass filter BPF, and a detector DET, which form a main circuit for radio frequency signals. An automatic gain control AGC amplifier and a power supply circuit (not illustrated) assist the modules which form the main circuit.

Figure 3:
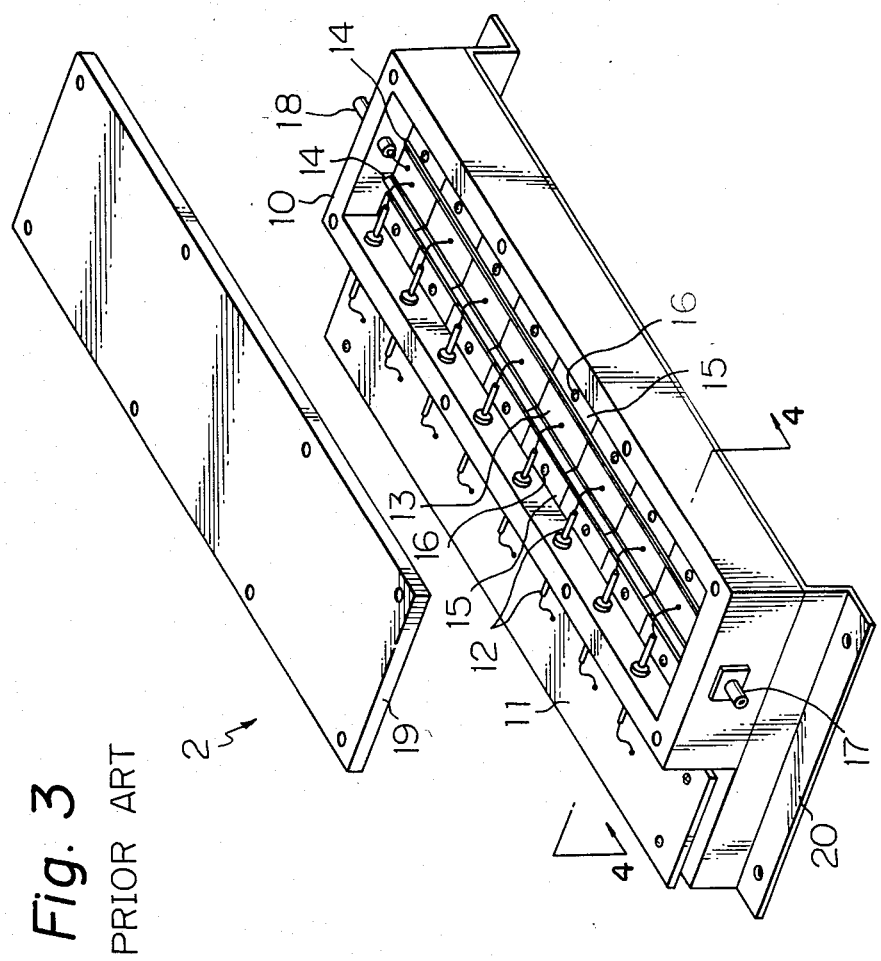
FIG. 3 is a perspective view of the structure of the main IF amplifier of FIG. 2, with the case cover detached.
Figure 4:
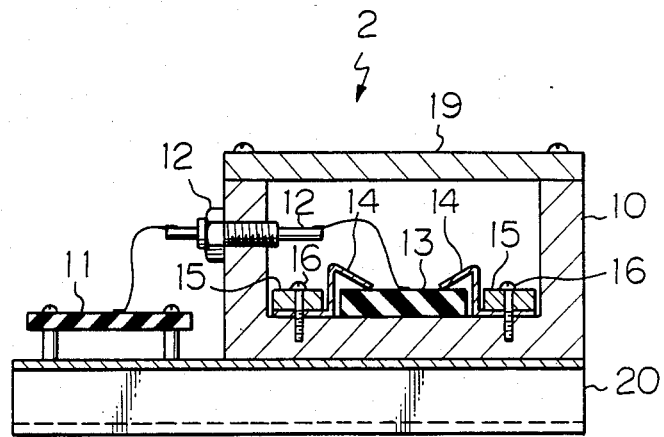
FIG. 4 is a cross-sectional view of the main IF amplifier of FIG. 2 taken along the line 4—4 in FIG. 3.

In FIGS. 3 and 4, the main IF amplifier 2 consists a case 10 having a top-open body and a detachable top cover 19. In the interior of the case 10, a plurality of thin-film hybrid integrated circuit (IC) substrates 13 are arrayed in a row and are secured to the bottom wall of the case 10 with plate springs 14, pressure plates 15, and screws 16. As is well known in the art, the substrate of a microwave integrated circuit is made of a ceramic having a high dielectric constant.

The aforementioned attenuators ATT1 through ATT5, amplifiers AMP1 through AMP6, band pass filter BPF, and detector DET consist of the circuits formed on the IC substrates 13. These circuits are electrically interconnected by a conductive ribbon or wire (not illustrated).

A signal input terminal (coaxial line) 17 is provided at one end wall and a signal output terminal (coaxial line)

18 is provided at the other end wall of the case 10. The signal input and output terminals 17 and 18 are connected to the row of IC substrates 13.

The case 10 is secured to a mounting bracket 20, to which a printed circuit board 11 is also secured. On the circuit board 11, the aforementioned AGC amplifier and power supply circuit are formed. The case 10 is also provided at the longitudinal side walls thereof with a plurality of connecting elements 12 extending through the case walls to electrically connect the circuit board 11 and the IC substrates 13.

The structure of the conventional main IF amplifier 2 described above has the following drawbacks:

1. Since the case 10 and the circuit board 11 are arranged side by side, the size of the amplifier 2 in the mounting plane is large and thus a large mounting area is required.

2. A large number of parts are required for securing the IC substrates 13, and, further the connecting elements 12 are disposed just above the securing screws 16. Accordingly, the work of mounting and demounting the IC substrates 13 is complicated and requires much time.

3. Since the input terminal 17 and the output terminal 18 are disposed on opposite sides, the freedom of mounting the main IF amplifier is very limited.

The present invention eliminates the above-mentioned drawbacks of the prior art. The preferred embodiments of the present invention are now described with reference to FIGS. 5 through 11.

Figure 5:
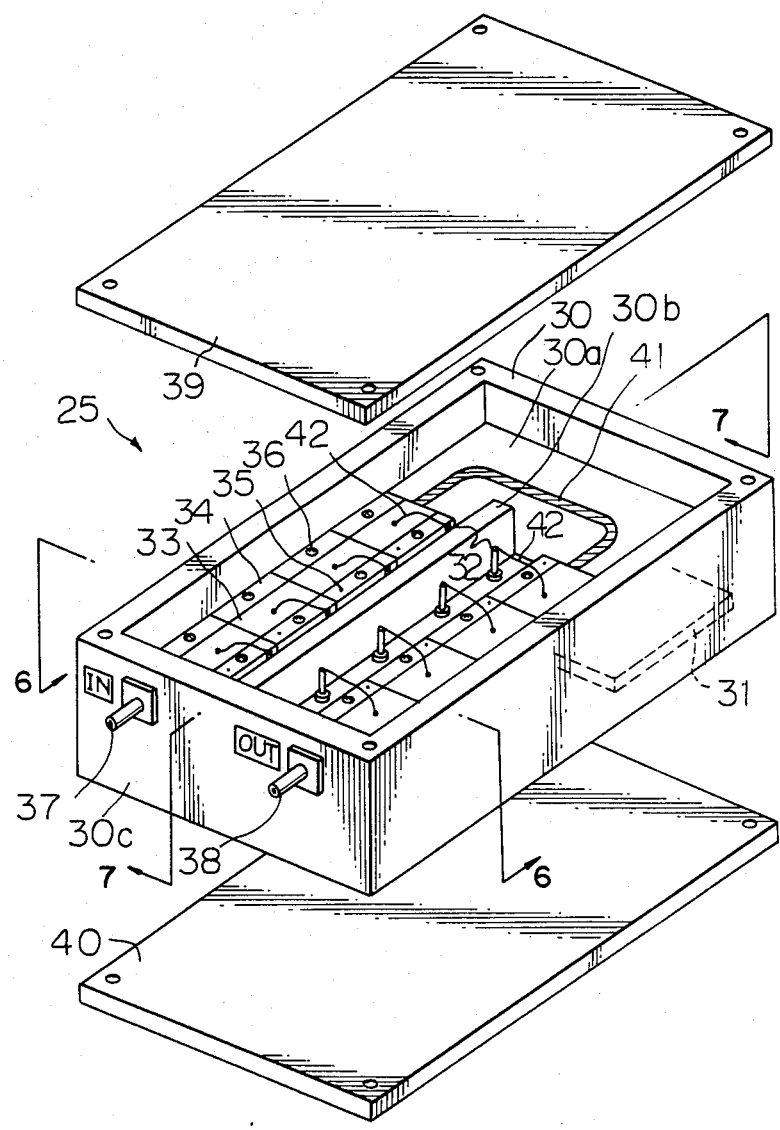
FIG. 5 is a perspective view of an embodiment of a main IF amplifier according to the present invention, with the case covers detached.

FIGS. 5 through 7 are diagrams of a main IF amplifier 25 according to the present invention which has the same circuit construction as that illustrated in FIG. 2. The amplifier 25 comprises a case 30 made of conductive material such as aluminum. The case 30 has a top and bottom-open body and detachable top and bottom covers 39 and 40, respectively. The case body has an intermediate partitional wall 30a, parallel to the covers 39 and 40, which divides the interior of the case body into an upper compartment and a lower compartment. The case body further has an interrupting wall 30b in the upper compartment which is perpendicular to the partitional wall 30a and extends along the longitudinal center line of the case body. The partitional wall 30a and the interrupting wall 30b may be made integral with the case body or made as separate parts attachable to the case body.

In the upper compartment of the case 30, a plurality of thin-film hybrid IC substrates 33 having circuits formed thereon, which form the above-mentioned attenuators ATT1 through ATT5, amplifier AMP1 through AMP6, band pass filter BPF, and detector DET are arrayed in two rows, with the interrupting wall 30b being interposed between the two rows of IC substrates. The interrupting wall 30b serves to interrupt the wave interference between the rows of IC substrates. As is shown in FIG. 6, each IC substrate 33 is fitted into a recess 34a in a carrier 34 made of a conductive material, such as brass, for example, and is soldered to the latter, thereby forming an IC module. The carrier 34 is secured to the partitional wall 30a with screws 36. Therefore, the IC module, i.e., the IC substrate 33 and the carrier 34, can be mounted and demounted together with the carriers 34, and, accordingly, the mounting and dismounting work can be performed much easier than that of the prior art described hereinbefore.

Moreover, the circuit on each IC substrate 33 is grounded to the partitional wall 30a via the carrier 34. Accordingly, the variation of the grounded characteristics after the circuit is mounted in the case (relative to those pre-adjusted by testing) is small, and the electrical characteristics are made unvariable.

Furthermore, on either the input side or the output side of each IC module (33 and 34), a mark 35 is placed so as to facilitate the work of mounting the IC modules.

The circuits of each row of IC substrates 33 are electrically interconnected, as is shown in FIGS. 8 and 9, by interconnecting channel-shaped connecting elements 45 mounted on end portions of the IC substrates 33 by means of a plate 47 (FIG. 9), for high frequency, or a ribbon or wire 46 (FIG. 8), for low frequency.

The two rows of IC substrates 33 are electrically interconnected by a strip circuit 41 disposed on the partitional wall 30a.

A signal input terminal (coaxial line, for example) 37 and a signal output terminal (coaxial line, for example) 38 are secured to the side wall 30c (FIG. 5) of the case 30 in positions corresponding to the respective rows of IC substrates 33 and extend through the case to be electrically connected to the respective IC substrate arrays.

A printed circuit board 31 is contained in the lower compartment of the case 30 and is secured to the partitional wall 30a with spacing bolts in a position corresponding to the strip circuit 41. The board 31 has circuits formed thereon, which form the above-mentioned AGC amplifier and power supply circuit. A through-type connecting element 43 is provided at a side wall of the case 30 so as to achieve an electrical connection between the circuit board 31 and the power source.

Connecting elements 32, for electrically connecting the circuit board 31 and the respective IC substrates 33, are secured to the partitional wall 30a in positions corresponding to the respective IC substrates 33. The elements 32 are disposed adjacent to the interrupting wall 30b and extend perpendicularly through the partitional wall 30a. The upper and lower ends of the elements 32 are electrically connected to the IC substrates 33 and to the circuit board 31, respectively, with wires 42.

Figure 10:
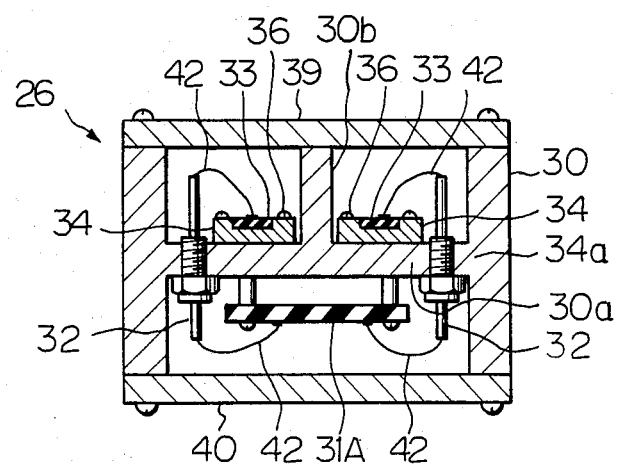
FIG. 10 is a cross-sectional view, corresponding to that of FIG. 6, of another embodiment of the present invention
Figure 11:
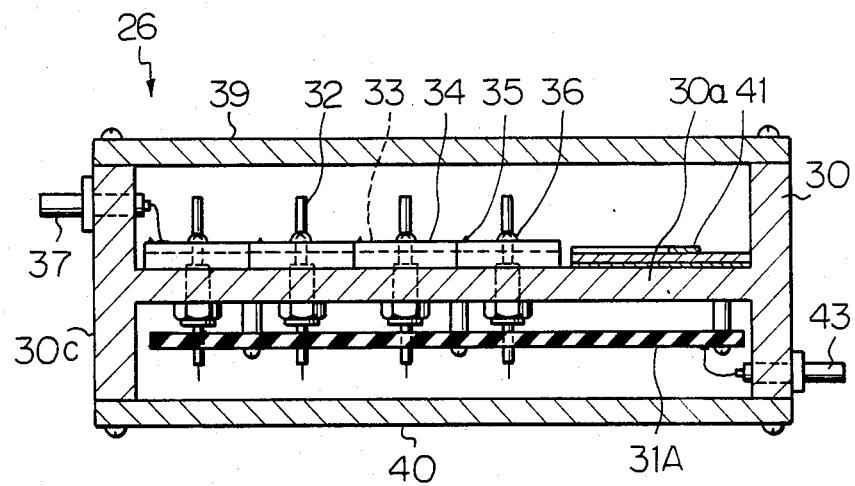
FIG. 11 is a cross-sectional view, corresponding to that of FIG. 7, of the embodiment of FIG. 10.

FIGS. 10 and 11 are diagrams of another main IF amplifier 26 according to the present invention. The amplifier 26 is basically the same as the amplifier 25 described above except that the connecting elements 32 are disposed adjacent to the side walls of the case 30 and an elongated printed circuit board 31A extends between the two rows of elements 32. Such an elongated circuit board 31A may be used in the amplifier 25 in FIGS. 5 through 7. If it is used, the circuit board 31A is provided with through holes or via holes into which the elements 32 are inserted.

It should be noted that the IC substrates contained in the case are arrayed in two rows in the embodiments described above, but they may be arrayed in three or more rows.

As was described above, the electronic device according to the present invention features arrangements of IC substrates, a circuit board, and connecting elements, which, when combined, make it possible to realize a very small-sized device. Moreover, the arrangement of the input and output terminals disposed at one side wall of the case allows a large degree of freedom for the mounting of the device. Furthermore, the carrier structure for the IC substrates makes it possible to realize very easy mounting and demounting of the IC substrates, as well as unvarying electrical characteristics.

We claim:

1. An electronic device comprising:
   a case made of conductive material;
   an intermediate partitional wall dividing the interior of the case into first and second electromagnetically isolated compartments;
   a single interrupting wall disposed perpendicularly on said intermediate partitional wall and within said first compartment;
   a plurality of integrated circuit substrates including microwave integrated circuits which form a main signal circuit for processing an input signal and emitting an output signal, said integrated circuit substrates being grounded to said intermediate partitional wall in said first compartment and arrayed in two rows, each of said rows including substantially the same number of microwave integrated circuits, and being electromagnetically separated by said interrupting wall which is interposed between said rows;
   means, electrically connected to said microwave integrated circuits, for electrically interconnecting said microwave integrated circuits in each of said two rows;
   strip circuit means, positioned at one end of said interrupting wall, for electrically connecting said two rows of microwave integrated circuits;
   a circuit board secured to said intermediate partitional wall in said second compartment, and having at least a power circuit formed thereon electrically connected to at least one of said microwave integrated circuits;
   connecting elements, electrically connecting said microwave integrated circuits and said power circuit, said connecting elements extending perpendicularly through said intermediate partitional wall and arranged on either side of the interrupting wall and along side said substrates; and
   a signal input terminal and a signal output terminal each electrically connected to said microwave integrated circuits, and extending through one of the side walls of said case.

2. An electronic device according to claim 1, further comprising carriers made of a conductive material and detachably secured to said intermediate partitional wall of said case, each of said integrated circuit substrates being fixedly secured to respective ones of said carriers to form a microwave integrated circuit module adapted for convenient mounting and demounting from said case.

3. An electronic device according to claim 1, wherein said connecting elements are disposed adjacent to said interrupting wall.

4. An electronic device according to claim 2, wherein said microwave integrated circuits each have an input side and an output side, and wherein each of said carriers is provided with a mark at either said input side or said output side of said microwave integrated circuits for facilitating the mounting of said carriers.

* * * * *

UNITED STATES PATENT AND TRADEMARK OFFICE
CERTIFICATE OF CORRECTION

PATENT NO. : 4,685,034

DATED : August 4, 1987

INVENTOR(S) : Sadayuki Tetsu, Yasuo Tanishima

It is certified that error appears in the above-identified patent and that said Letters Patent is hereby corrected as shown below:

In the Abstract, [57], line 9, "integrated circuits" should be -- substrates --.

Signed and Sealed this

Twelfth Day of January, 1988

Attest:

DONALD J. QUIGG

*Attesting Officer*  *Commissioner of Patents and Trademarks*